(12) United States Patent
Viswanadam

(10) Patent No.: US 7,785,928 B2
(45) Date of Patent: Aug. 31, 2010

(54) INTEGRATED CIRCUIT DEVICE AND METHOD OF MANUFACTURING THEREOF

(76) Inventor: Gautham Viswanadam, Block 103 #05-771, Serangoon North Ave 1, Singapore (SG) 550103

( * ) Notice: Subject to any disclaimer, the term of this patent is extended or adjusted under 35 U.S.C. 154(b) by 0 days.

(21) Appl. No.: 11/988,452

(22) PCT Filed: Jul. 9, 2005

(86) PCT No.: PCT/SG2005/000225
§ 371 (c)(1),
(2), (4) Date: Feb. 22, 2010

(87) PCT Pub. No.: WO2007/008171
PCT Pub. Date: Jan. 18, 2007

(65) Prior Publication Data
US 2010/0144093 A1    Jun. 10, 2010

(51) Int. Cl.
*H01L 21/44* (2006.01)
(52) U.S. Cl. ............... 438/112; 438/127; 257/E23.085; 257/E23.135
(58) Field of Classification Search ............. 438/112, 438/127
See application file for complete search history.

(56) References Cited

U.S. PATENT DOCUMENTS

| | | | |
|---|---|---|---|
| 6,344,687 B1 | 2/2002 | Huang | |
| 6,759,738 B1* | 7/2004 | Fallon et al. | 257/690 |
| 6,989,584 B1* | 1/2006 | Chiang | 257/666 |
| 2002/0168797 A1* | 11/2002 | DiStefano et al. | 438/106 |
| 2003/0127746 A1* | 7/2003 | Isaak et al. | 257/777 |
| 2003/0160325 A1 | 8/2003 | Yoneda | |
| 2004/0041251 A1 | 3/2004 | Goller | |
| 2004/0183195 A1 | 9/2004 | Huang | |
| 2005/0006737 A1 | 1/2005 | Islam | |
| 2005/0062169 A1 | 3/2005 | Dubin | |
| 2006/0284301 A1* | 12/2006 | Corisis | 257/690 |
| 2007/0132081 A1* | 6/2007 | Wang et al. | 257/686 |
| 2007/0281393 A1* | 12/2007 | Gautham et al. | 438/113 |

FOREIGN PATENT DOCUMENTS

| | | |
|---|---|---|
| JP | 59208756 A | 11/1984 |
| JP | 11195742 A | 7/1999 |
| JP | 2004349716 A | 12/2004 |
| WO | WO 03/037053 A1 | 5/2003 |

* cited by examiner

*Primary Examiner*—Alexander G Ghyka
(74) *Attorney, Agent, or Firm*—Jacobson Holman PLLC

(57) ABSTRACT

A method of manufacturing an integrated circuit (IC) device is disclosed. A wafer including multiple dies is processed to form solder bumps at the bond pad locations. A conductive substrate is patterned for routing traces and connection pads and partially etched. Routers are formed to electrically route a connection pad to the interior of its corresponding routing terminals. The etched connection pads corresponds to the plurality of bond pad locations of the IC chip. The bumped IC chip is aligned and attached to the conductive substrate through the connection pads and solder bumps. The attached IC chip and the first side of the conductive substrate are then encapsulated. Un-processed conductive material is then removed from a second side of the substrate, opposite the first side, to expose the routers and routing terminals. Contacts are formed on the second side of the substrate that electrically connect with the routers in the interior of the connection pads to thereby electrically connect with the connection terminals on the first side of the IC chip. The packaged IC are then separated along the separation lines to produce individualized dies. An IC device including a separated die is also disclosed.

37 Claims, 4 Drawing Sheets

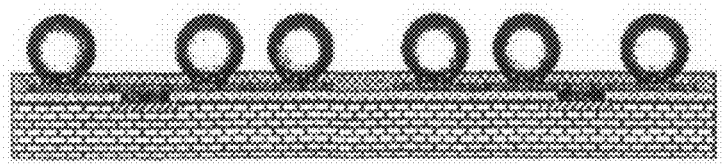
Fig. 1A – Prior art
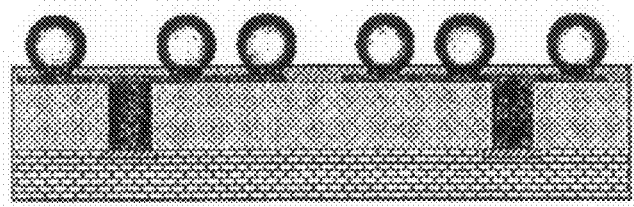
Fig. 1B – Prior art
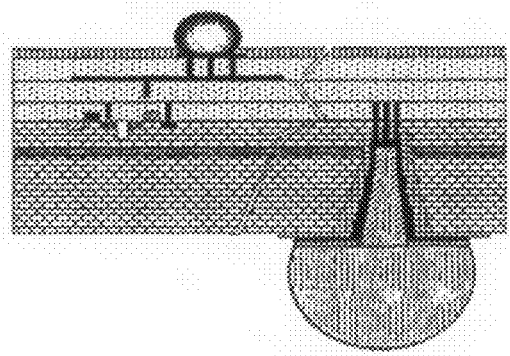
Fig. 1C – Prior art
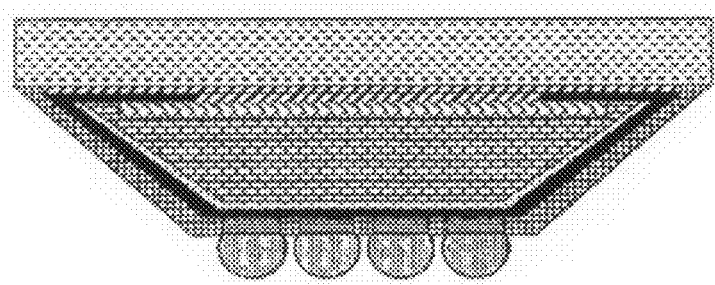
Fig. 1D – Prior art
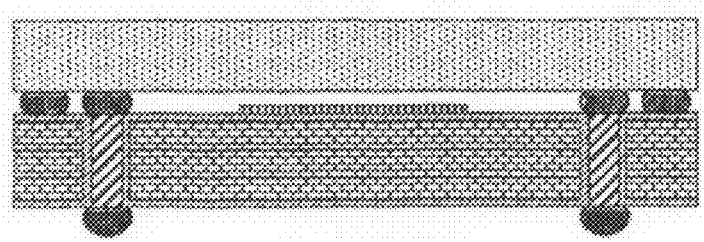
Fig. 1E – Prior art

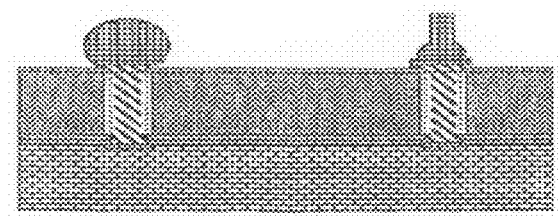
Fig. 1F – Prior art
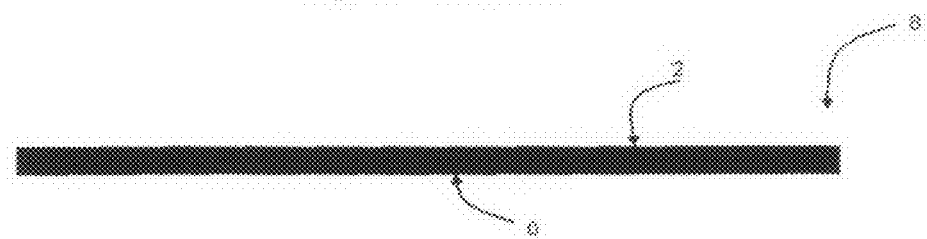
Fig. 2
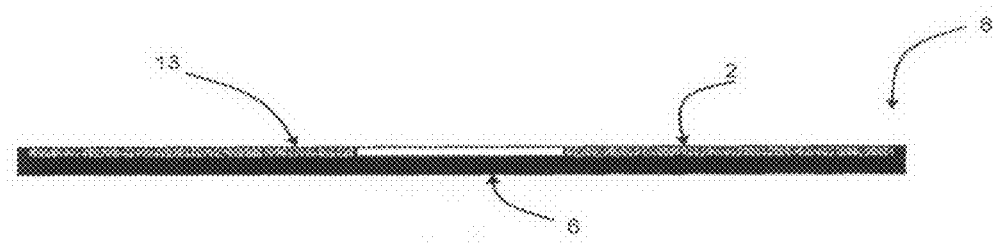
Fig. 3
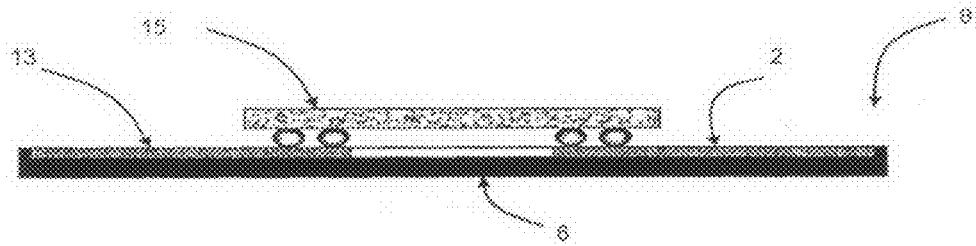
Fig. 4
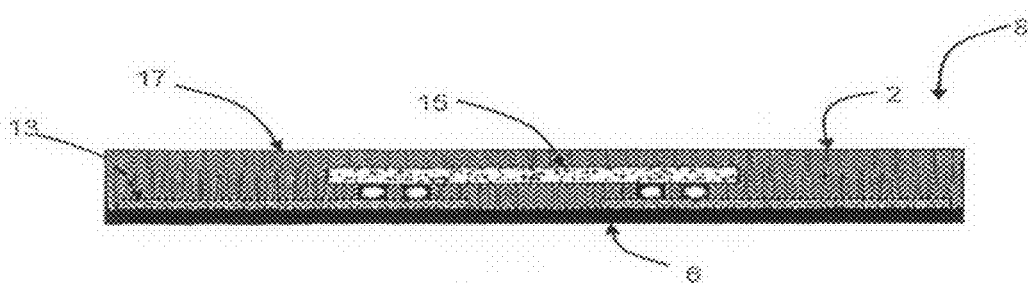
Fig. 5

INTEGRATED CIRCUIT DEVICE AND METHOD OF MANUFACTURING THEREOF

This is a national stage of International Application No. PCT/SG2005/000225 filed on Jul. 9, 2005 and published in English.

BACKGROUND

This invention relates generally to an integrated circuit (IC) device and a method of manufacturing the IC device. More particularly, this invention relates to an IC device including one die or two or more dies arranged in a matrix array package configuration so as to achieve very high pin counts and multiple functionality with in the defined device geometry, and to a method of manufacturing such an IC device.

With the miniaturization of electronic products, there is a need to also reduce the size of IC packaged devices and to add more functionality so that more of these IC devices can be packed into a given area of a substrate. Two approaches have been taken to meet such a need. A first approach is to reduce the size of packaging of existing IC device packages. The second approach is focused on increasing the functionalities provided by each IC device, for example to form a system-in-package (SIP) devices.

FIGS. 1A- 1F show prior art IC devices fabricated in a wafer level configuration. Each individual device is packaged while they are still available in wafer form, prior to the wafer dicing process to obtain chip sized package. Many packaging process steps are added directly on a wafer to realize these chip sized packages, which are of small form factor and reduced weight, However, the IC device obtained in this method are limited to the IO density as the chip size determines the package IO density.

U.S. Pat. Nos. 6,777,267; 6,768,331; 6,667,543; 6,635,509; 6,596,560; 6,593,220; 6,465,281; 6,452,238; 6,441,488; 6,429,511; 6,341,070; 5,448,014 discloses an IC device having a footprint approximately the size of a die of the IC device. The steps for manufacturing the IC device includes: (1) providing a wafer that includes multiple dies wherein each die includes multiple connection pads, Different packaging process steps are added to arrive at the final IC device before the same are separated.

SUMMARY

According to an aspect of the present invention, there is provided a method of manufacturing an integrated circuit (IC) device. According to the method, a wafer including multiple dies separated by separation zones is first provided. Each die includes connection terminals on a first active side of the wafer is separated by wafer dicing process well known in the art of semiconductor manufacturing. A conductive substrate of pre determined thickness and size are patterned for routing traces and partially etched on a first side, by photolithographic method well known in the art of semiconductor process. The patterning and etching are done such that each circuit routing trace pattern corresponds to the plurality of connection terminals that are present in the individual IC chip. Multiple Chip level patterns are arranged in array form on a conductive substrate by clearly defining separation zones to package multiple IC devices simultaneously. Each IC chip's connection terminals are aligned and attached with their plurality of corresponding connection pads on the first side of a substrate. The first side of a substrate along with the attached IC chips are fully encapsulated. The excess conductive material on the second side of the conductive substrate is then removed to expose the patterned and partially etched routing traces of the first side of a substrate. Interconnect contacts are formed on the second side of the substrate. These contacts are electrically connected to the routing terminals in the interior of the partially etched patterns thereby electrically connect with the connection terminals on the first side of the IC chip. The IC chips are separated along the separation zones of the substrate to produce individualized packages, each of which serves as an IC device.

Preferably, the method may further include forming a plurality of connection pads on the first side of conductive substrate by additive and or subtractive methods that are well known in the art of semiconductor fabrication processes.

Preferably, the method may further include forming the circuit patterns by additive and or subtractive methods that are well known in the art of semiconductor fabrication processes.

Preferably removing substrate material includes removing conductive material from a second side of the substrate, opposite the first side, to expose the patterned circuit layer on the first side of the substrate.

Preferably, the method may further include substrate etching depth be determined by functional requirements.

The method may further include forming terminals electrically connected to the contacts. Preferably, forming terminals includes forming a solder mask over the routers and contacts on the second side of the substrate, removing portions of the solder mask over the contacts to expose the contacts and forming solder bumps over the exposed contacts.

The method may further include, providing a build-up layer directly on the second side of the substrate in order to eliminate the organic build up of BGA package.

The method may further include routers that route connection pads on a first side of the substrate to corresponding contacts on the second side of the substrate, after the build-up layers.

Preferably, the method further includes providing at least two functional IC chips interconnected on the first side of the substrate adjacent to each other to form a system in package (SIP) configuration.

According to another aspect of the present invention, there is provided an integrated circuit (IC) device manufactured according to the method described above. This IC device includes a first die having multiple connection pads on a first active side routed to the corresponding contacts on a second side of the first conductive substrate. The second IC device having multiple connection pads on its first side are routed to the second side of a second conductive substrate. The contacts on the second side of the first conductive substrate of the first die and the contacts on the second side of the second conductive substrate of the second die are further connected using an interposer with conductive contacts forming a stack configuration.

Preferably, the interposer for connections is made of a flexible circuit board for interconnections between IC devices to the printed circuit board.

According to another aspect of the present invention, there is provided an integrated circuit (IC) device manufactured according to the method described above.

This IC device includes a first die having multiple connection pads on a first active side routed to the corresponding contacts on a second side of the first conductive substrate. Some or all of the ground plane contacts on the second side of the substrate are electrically connected to the heat sink attached to the second side of the molded IC chip.

BRIEF DESCRIPTION OF DRAWINGS

The invention will be better understood with reference to the drawings, in which:

FIG. 1A to 1F are sectioned drawings of a prior art IC devices having a wafer level package configuration and connected to a substrate using solder bumps;

FIG. 2 is a sectioned drawing of the present invention method, showing a first side one (2) and second side (6) of the conductive substrate 8);

FIG. 3 is a sectioned drawing of the present invention, showing patterned routing trace circuitry (13) that is partially etched on the first side (2) of the conductive substrate (8);

FIG. 4 is a sectioned drawing of the present invention method, showing a flip chip (15) attached to the routing trace circuitry (13) on the first side (2) of the conductive substrate (8);

FIG. 5 is a sectioned drawing of the present invention method, after fully encapsulating (17) the first side (2) of the substrate (8) with flip chip (15) attached to the patterned and etched routing trace circuitry (13);

DETAILED DESCRIPTION

Figure 6:
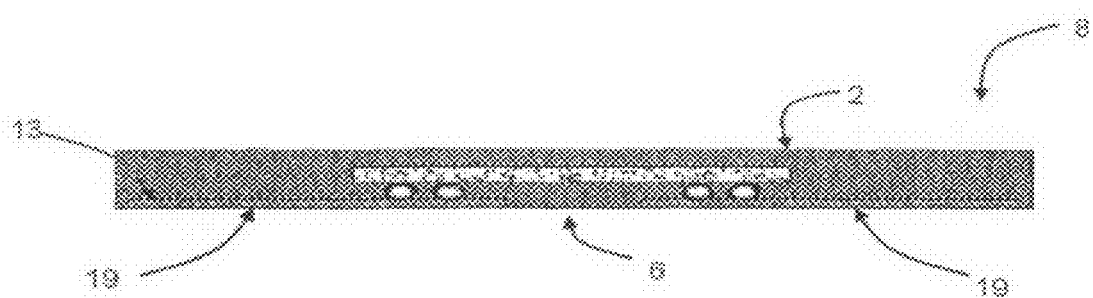
FIG. 6 is a sectioned drawing of the present invention method, showing exposed routing trace circuitry (19) on the second side (6) of the conductive substrate (8)
Figure 7:
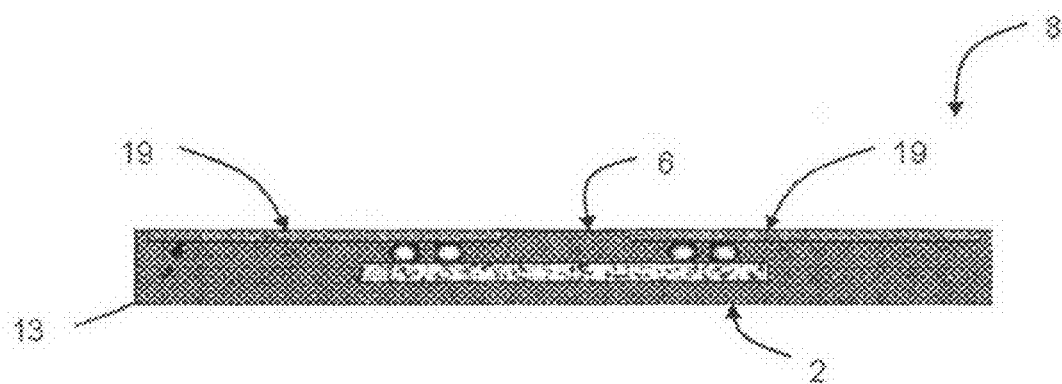
FIG. 7 is a flipped drawing of FIG. 6 shown for easy understanding of further steps of this method of invention.

FIGS. 2 through 8 are drawings showing steps for manufacturing an integrated circuit (IC) device (10) according to an embodiment of the present invention. The sequence starts in a PROVIDE AN ELECTRICALLY CONDUCTIVE SUBSTRATE (8) (FIG. 2). The substrate (8) may be a four, six, eight or twelve-inch square or round in size. Multiple bond pads or connection pads that corresponds to the plurality of connection terminals of IC devices, along with routing trace circuit patterns (13) are patterned on the first side (2) of the conductive substrate (8) and partially etched (13) (FIG. 3). The connection pads on the conductive substrate, having plurality of corresponding connection terminals of IC devices may preferably be processed on the conductive substrate by techniques and skills that are well known in the art of semiconductor manufacturing and not discussed in this invention method. Preferably the entire first side (2) of the conductive substrate may be fully populated with the plurality of multiple IC device connection pads and routing trace circuitry to obtain a matrix array substrate. Pre-solder bumped IC devices (15) (FIG. 4) are flip chip bonded with respective bond pads on the first side (2) of the conductive substrate. The bonding of IC device to the substrate are very well known to the people skilled in the art of semiconductor assembly and not discussed here. The first side (2) of the conductive substrate (8) is fully encapsulated (17) (FIG. 6) after the IC devices (15) have been attached to the substrate routing trace circuitry (13). Preferably the encapsulation method may involve a transfer molding and or an Injection molding methods using vacuum that are well known to the people skilled in the art of encapsulation techniques. The un-disturbed conductive material on the second side of the conductive substrate (6) (FIG. 2) is subsequently removed by chemical and or mechanical processes that are well known to the people skilled in the art of semiconductor processes. Preferably the un-disturbed material on the second side (6) of the substrate (8) is removed in-order to expose the circuitry (13) that is partially etched on the first side (2) of the substrate (8);

The next step proceeds to a FORM BUILD-UP LAYERS (21 and 23) (FIG. 8) on the exposed circuitry at the second side (6) of the substrate (8) to rout the interconnects and obtain a fully encapsulated chip scale package configuration (10) and function. Preferably copper may be used as a conductive trace (21) (FIG. 8) material and solder mask be used for dielectric layer (23) purposes. The final passivation mask layer (25) (FIG. 8) has been deposited, portions of the passivation layer (25) over the connection pads (21) are removed using conventional techniques, such as photolithography and etching, in a REMOVE PASSIVATION LAYER PORTIONS to expose the connection pads (27) (FIG. 8).

Figure 8:
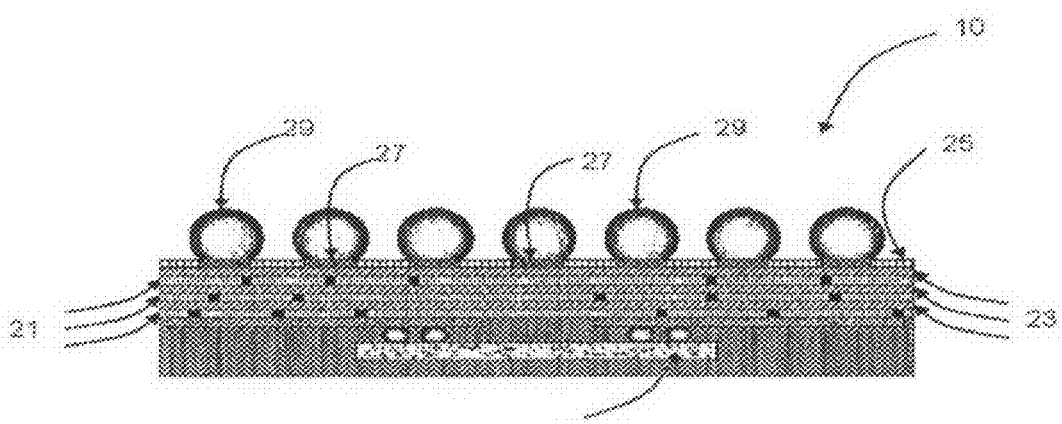
FIGS. 8 is a sectioned drawing of the current invention method showing a completed IC device (10) with build up interconnect/insulation layers (21, 23), a solder masking layer (25), solder under bump metallurgy. (27) and solder bumps (29)

The next step proceeds to a FORM TERMINALS, wherein the substrate (8) is further processed to include electrical terminals such as solder bumps (2)9 (FIG. 8). Preferably, this step includes a FORM SOLDER MASK wherein the surface on the second side (6) of the substrate is coated with a layer of solder mask (25) or a third passivation layer, preferably 1 to 25 micron thick as shown in FIG. (8). Portions of the solder mask (25) or the third passivation layer covering the contacts (27) are next removed using any conventional technique in a REMOVE SOLDER MASK PORTIONS step to expose the contacts (27). The solder bumps (29) are then formed in a FORM SOLDER BUMPS step over the contacts (27) on the second side 6 of the substrate (8) to function as terminals for the dies (15), as shown in FIG. 8. The sequence finally ends in a SEPARATE DIES step not shown in the method of invention.

Figure 9:
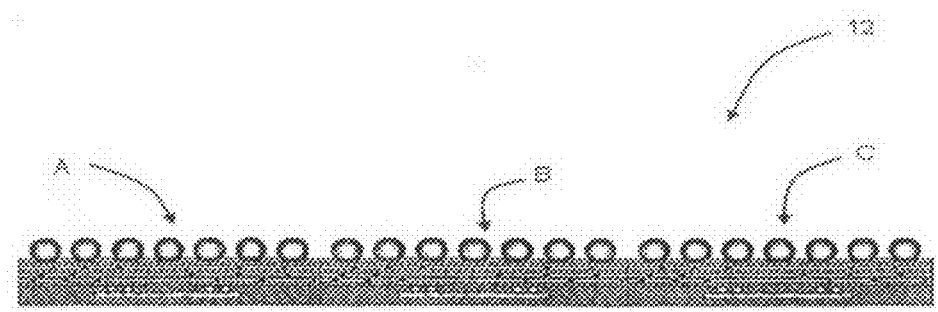
FIG. 9 is a sectioned drawing of a different embodiment shown with three different IC devices (A, B & C) packaged to arrive at a system in package (SIP) configuration (12)

It should be noted that the IC device (10) produced according to the above sequence is only one possible embodiment of the present invention. IC devices, such as IC device (12) shown in FIG. 9, according to other embodiments can also be manufactured with some steps in the sequence The structure of the IC device (12) produced according to a above sequence is next described. The IC device (12) includes three different functional devices (A, B & C) attached to the conductive substrate. All the three chips are interconnected by the upper routing trace circuitry and connection pads on the side one of the substrate. Subsequently, side one of the substrate is fully encapsulated by molding compound or a suitable polymer/composite after the IC chips (A, B & C) are attached. The un-distrubed conductive material on the second side of the substrate is now removed and the first side circuitry exposed. Forming appropriate build-up layers on the second side of the substrate to route the new interconnect bump locations and singulation of the multi-chip module (otherwise now known as System in Package-SIP) thus completes the process for this embodiment.

Figure 10:
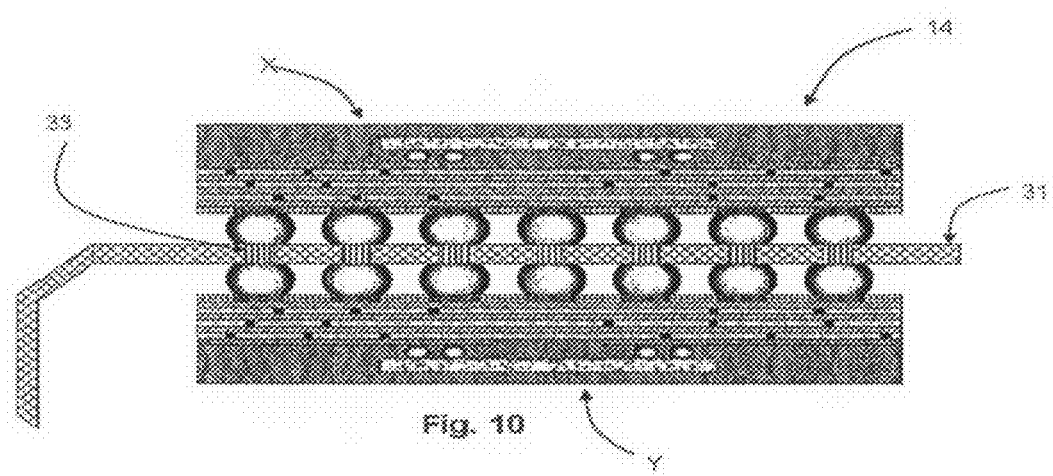
FIG. 10 is a sectioned drawing of yet another embodiment showing two different IC devices (X & Y) packaged to arrive at a stack package configuration.

Another embodiment of the IC chip (14) fabrication is shown in FIG. 10 where two IC devices (X & Y) fabricated using this method of invention are vertically stacked using a flex substrate to further increase the functional capability of the IC chip (14). The IC chips (X & Y) of a stacked-die IO device (14) may be of the same function or of different functions. An example of a stacked-die IC device having dies of different functions includes a processor die, a memory die and a MEMS die in a stacked configuration to produce a system-in-chip (SIC) device. These stacked-die IC devices may also be used for non-optical type of devices, such as MEMS and surface acoustic wave (SAW) devices.

Figure 11:
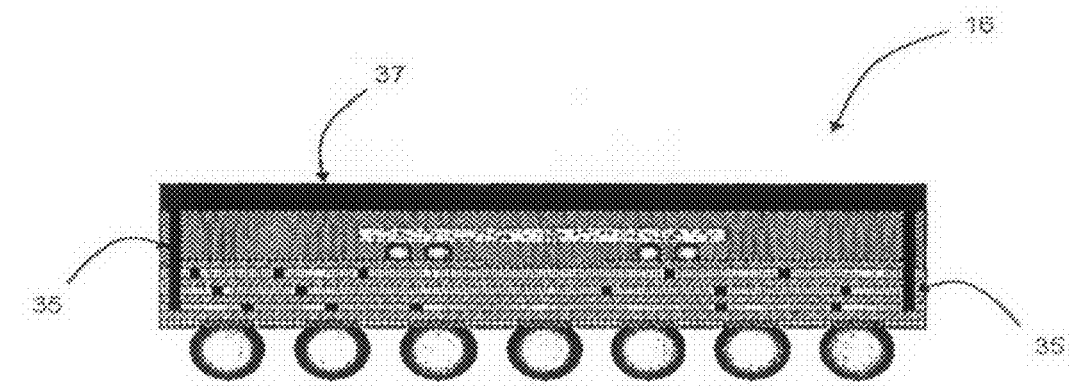
FIG. 11 is a sectioned drawing of yet another embodiment (16) showing a through hole filled conductor (35) bridging the ground planes of the build-up levels (23) with the heat sink (37) attached on the top side of the IC chip for grounding and electrical shielding purposes.

Another embodiment of the IC chip (16) fabrication is shown in FIG. 11 where a through conduct trace (35) is formed between the ground planes and connected with the heat sink (37) on top side of the IC device 16 to provide a good electromagnetic shielding and very effective thermal management that is required for RF wireless and or high power applications.

I claim:

1. A method of manufacturing an integrated circuit (IC) device package comprising:
   providing an integrated circuit device having connection terminals;
   providing a substrate having a first side and a second side;
   forming a plurality of connection pads on the first side of the substrate, the plurality of connection pads corresponding to the connection terminals of the integrated circuit device;
   forming traces on the first side of the substrate for electrically connecting the connection terminals of the integrated circuit device to external circuitry;
   attaching the connection terminals of the integrated circuit device to the corresponding connection pads on the first side of the substrate;
   encapsulating the first side of the substrate to embed the integrated circuit device inside the encapsulant together with the traces;
   removing the substrate from the second side, opposite the first side, of the substrate to expose the traces; and
   providing an encapsulation tool with a through hole on at least one side of the IC device encapsulant to form the integrated circuit device package.

2. A method according to claim 1, further comprising providing a plurality of integrated circuit devices each having connection terminals, and attaching each integrated circuit device to a corresponding connection pads on the first surface of the substrate to form a plurality of integrated circuit device packages.

3. A method according to claim 2, further comprising separating along separation lines between integrated circuit devices to form a plurality of separate integrated circuit device packages.

4. A method according to claim 1, wherein forming the connections pads and traces is by an additive process.

5. A method according to claim 1, wherein forming the connection pads and traces is by a subtractive process.

6. A method according to claim 1, wherein conductive bumps are formed on the connection terminals of the IC devices.

7. A method according to claim 6, further comprising attaching an IC device with the plurality of bumped connection terminals to the connection pads on the first side of the first substrate.

8. A method according to claim 7, wherein attaching an IC device to the plurality of connection pads on the first side of the substrate comprising:
   applying solder flux on the substrate and or conductive bumps of the IC device;
   aligning the plurality of connection terminals of the IC device with the corresponding connection pads of the substrate;
   reflowing the substrate along with the IC devices to complete the attachment process.

9. A method according to claim 1, wherein encapsulating further comprising providing encapsulation on the first side of the substrate along with the attached IC device to fully enclose the IC device.

10. A method according to claim 9, wherein providing encapsulation on the first side of the substrate further comprises any of:
    transfer molding of the first side of the substrate with thermo set compound that is attached with the IC device;
    injection molding of the first side of the substrate that is attached with the IC device; or
    mold compound printing and curing on the first side of the substrate that is attached with the IC device.

11. A method according to claim 10, further comprising removing the substrate is for exposing the routing traces, routing terminals and molded surface on the first side of the substrate.

12. A method according to claim 11, wherein removing the substrate, the removing process is wet chemical etching, mechanical aberration, dry chemical etching, sand blasting, water blasting, or laser etching.

13. A method according to claim 1, further comprising re-routing the connection pads that are routed to routing terminals on the first side of the substrate to an external printed circuit board.

14. A method according to claim 13, wherein re-routing of the connection pads further comprises:
    depositing organic photo sensitive passivation coating or film on the exposed traces on the second side of the substrate;
    opening the routing terminals by photolithographic process on the organic passivation;
    depositing a layer of conductive metal coating and or film over the organic passivation;
    defining the traces and connection pads on the substrate, over the organic passivation and patterning the traces using potolitographic process;
    depositing another layer of photo sensitive organic passivation layer over the re-routed conductive traces;
    opening the connection pad via in the organic passivation.

15. A method according to claim 14, wherein the photo sensitive organic film is solder mask dry film or spin-on non conductive polymer materials the conductive metal coating is aluminium, copper, nickel, palladium, tin, gold, or an electrical conductor.

16. A method according to claim 14, wherein the deposition method of passivation films is spin coating, lamination, vapour deposition, or electrolytic deposition and the deposition method of conductive traces and pads is electro-less plating, electrolytic plating, sputtering, e-beam evaporation, screen printing, or lamination.

17. A method according to claim 1, further comprising providing under bump metallurgy at the exposed connection pad via in the organic passivation layer to wet and join to the solder materials.

18. A method according to claim 17, wherein providing under bump metallurgy at the exposed connection pads, the under bump metallurgy is electro less plating of nickel and gold, electro less plating of copper and gold, silver conductive bumps, gold conductive bumps, or conductive polymer bumps.

19. A method according to claim 3, where in separating along the separation lines of the substrate is wafer dicing process, laser dicing/cutting process, or die shearing process.

20. A method according to claim 1, wherein the IC device package further comprises two or more IC devices to be interconnected and processed on a single substrate module simultaneously.

21. A method according to claim 20, wherein the substrate further comprises processed with plurality of terminal connection pads for two or more IC devices in a MCM tile single module.

22. A method according to claim 20, where in the said IC devices are from the same or different functional wafers.

23. A method according to claim 1, wherein the traces vary in dimensions depending on power, ground and signal input/output connections.

24. A method according to claim 1, wherein the IC device is about 30 micrometers in thickness.

25. A method according to claim 1, wherein the through holes on the encapsulated IC device is partially or fully filled with electrically and thermally conductive material.

26. A method according to claim 25, wherein the conductive material that is in the mold through hole is interconnected with the ground plane of the IC device that is routed on the second side of the substrate.

27. A method according to claim 25, wherein the exposed top side of the molded IC device comprises a conductive material.

28. A method according to claim 25, wherein the depositing of the conductive material on the exposed top side of the molded IC device is electroplating method, electro-less plating method, sputter process method, conductive paste printing method, lamination method, or thermal adhesive paste or film attachment method.

29. A method according to claim 25, wherein the conductive material on the top side of the molded IC device is joined to the through hole conductive material of the molded IC device.

30. A method according to claim 29, wherein the conductive material the top side of the molded IC device acts as a thermal conductor for the IC device.

31. A method according to claim 29, wherein the conductive material the top side of the molded IC device acts as an electromagnetic shielding of the IC device.

32. A method according to claim 1 further comprising:
forming electrical connection terminals on $1^{st}$ and $2^{nd}$ side of an intermediate flexible printed circuit board to accept two or more IC devices for stack configuration; and
assembling the individualized IC devices on either side of the intermediate flexible printed circuit board to form a stack package.

33. A method according to claim 32, wherein the IC device is an intermediate circuit board to form a stack package to increase the functional capability of the IC device.

34. A method according to claim 33, wherein the intermediate circuit board is of flexible or a rigid type.

35. A method according to claim 33, wherein the intermediate circuit board accepts the IC devices on both sides to form a stack device.

36. A method according to claim 33, wherein the intermediate circuit board is from plastic, ceramic, glass, or silicon substrate.

37. A method according to claim 33, wherein the intermediate circuit board comprises connection routers and terminals, the method of forming the connection routers and terminals is plating and etching method or conductive paste printing method.

* * * * *